United States Patent
Sprouse et al.

(10) Patent No.: US 8,634,239 B2
(45) Date of Patent: Jan. 21, 2014

(54) HYBRID MULTI-LEVEL CELL PROGRAMMING SEQUENCES

(75) Inventors: Steven Sprouse, San Jose, CA (US);
Chris Avila, Sunnyvale, CA (US);
Sergey Anatolievich Gorobets,
Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 131 days.

(21) Appl. No.: 13/339,017

(22) Filed: Dec. 28, 2011

(65) Prior Publication Data
US 2013/0170293 A1 Jul. 4, 2013

(51) Int. Cl.
*G11C 11/34* (2006.01)

(52) U.S. Cl.
USPC ............ 365/185.03; 365/185.11; 365/185.12; 365/185.24; 365/185.29

(58) Field of Classification Search
USPC ............. 365/185.03, 185.11, 185.12, 185.24, 365/185.29
See application file for complete search history.

(56) References Cited

U.S. PATENT DOCUMENTS

| | | |
|---|---|---|
| 6,222,762 B1 | 4/2001 | Guterman et al. |
| 7,120,051 B2 | 10/2006 | Gorobets et al. |
| 7,126,928 B2 | 10/2006 | Tiedemann, Jr. et al. |
| 7,173,859 B2 | 2/2007 | Hemink |
| 7,237,074 B2 | 6/2007 | Guterman et al. |
| 7,345,928 B2 | 3/2008 | Li |
| 7,420,847 B2 | 9/2008 | Li |
| 7,440,331 B2 | 10/2008 | Hemink |
| 7,457,163 B2 | 11/2008 | Hemink |
| 7,688,638 B2 | 3/2010 | Hemink |
| 7,843,739 B2 | 11/2010 | Hemink |
| 7,876,611 B2 | 1/2011 | Dutta et al. |
| 7,961,511 B2 * | 6/2011 | Lee et al. ................. 365/185.03 |
| 2010/0157675 A1 | 6/2010 | Shalvi et al. |
| 2010/0220509 A1 | 9/2010 | Sokolov et al. |
| 2010/0246260 A1 | 9/2010 | Kang |

OTHER PUBLICATIONS

The International Search Report issued Apr. 29, 2013 in corresponding PCT Appln. No. PCT/US2012/070557 (3 pages).
The Written Opinion of the International Searching Authority issued Apr. 29, 2013 in corresponding PCT Appln. No. PCT/US2012/070557 (7 pages).
Olson, Alan R. and Langlois, Denis J., "Solid State Drives Data Reliability and Lifetime", Imation, Apr. 7, 2008 (27 pages).

* cited by examiner

*Primary Examiner* — Trong Phan
(74) *Attorney, Agent, or Firm* — Brinks Gilson & Lione

(57) ABSTRACT

A memory device implements hybrid programming sequences for writing data to multiple level cells (MLCs). The memory device obtains specified data to write to the MLC and selects among multiple different programming techniques to write the specified data. Each of the programming techniques establishes a charge configuration in the MLC that represents multiple data bits. The memory device writes the specified data to the MLC using the selected programming technique. In one implementation, the programming techniques include a robust programming technique that preserves previously written data in the MLC in the event of a write abort of the specified data and an additional programming technique that has higher average performance than the robust programming technique. The selection may be made based on a wide variety of criteria, including whether data has been previously written to a block that includes the MLC.

25 Claims, 5 Drawing Sheets

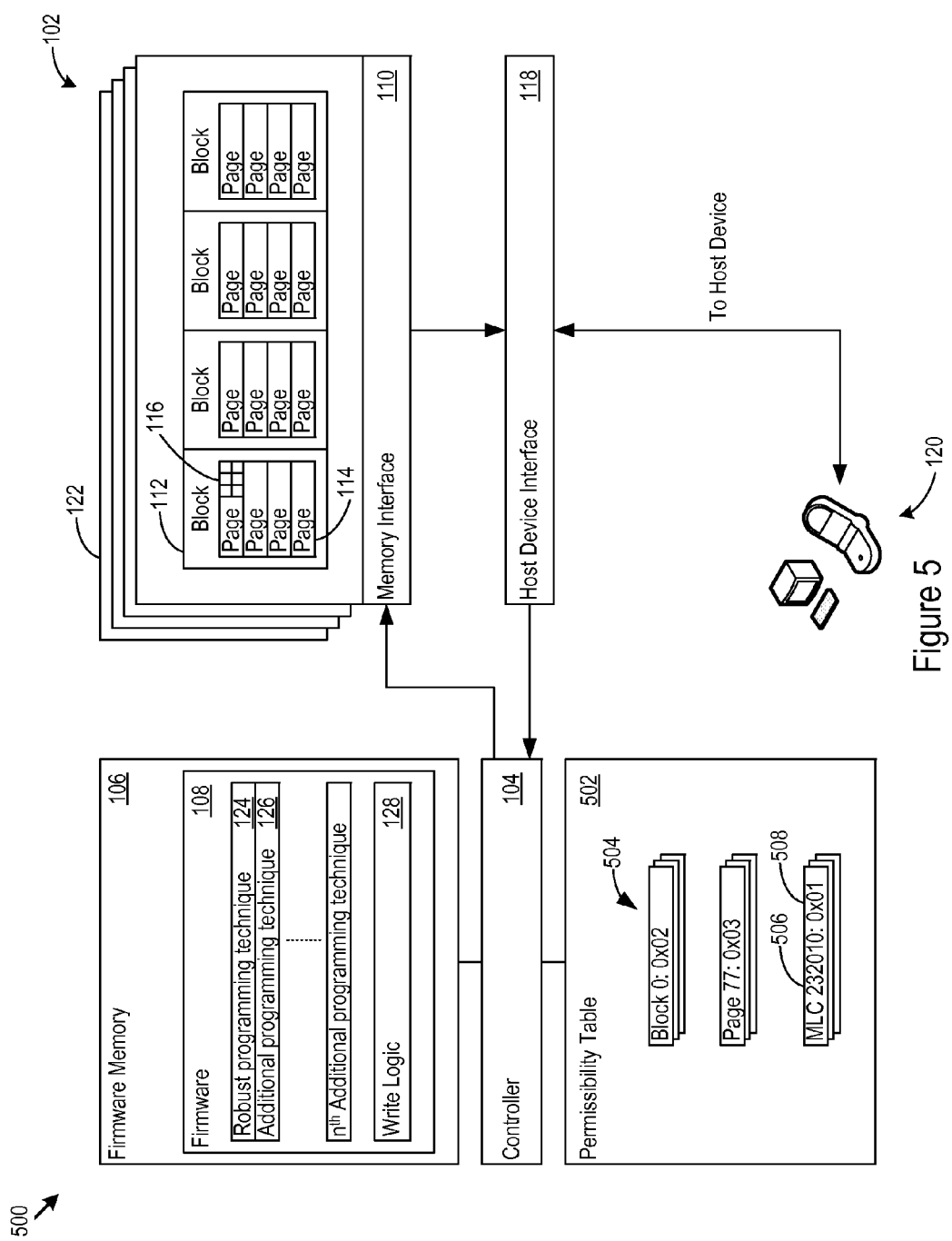

HYBRID MULTI-LEVEL CELL PROGRAMMING SEQUENCES

BACKGROUND OF THE INVENTION

1. Technical Field

This disclosure relates to non-volatile memories that employ multiple level cells (MLCs). In particular, this disclosure relates to selective application of different MLC programming techniques to provide a blend of speed and reliability benefits for non-volatile memories.

2. Related Art

Continual development and rapid improvement in semiconductor manufacturing techniques have led to extremely high density memory devices. The memory devices are available in a wide range of types, speeds, and functionality. Memory devices often take the forms, as examples, of flash memory cards and flash memory drives. Today, capacities for memory devices have reached 64 gigabytes or more for portable memory devices such as Universal Serial Bus (USB) flash drives, and one terabyte or more for solid state disk drives. Memory devices form a critical part of the data storage subsystem for digital cameras, digital media players, home computers, and an entire range of other host devices.

In recent years, multiple level cells (MLCs) have been developed and deployed to increase storage capacity. MLCs store charge configurations that define multiple bits of information. For example, a MLC that stores two bits of information is programmable between four different charge configurations. Such an MLC typically is conceptually divided into a lower page that stores, for example, the least significant bit of the two bits stored in the MLC, and an upper page that stores, for example, the most significant bit. In some instances, the lower pages are written first, and when the upper pages in specific MLCs are needed to store additional data, a programming technique adjusts the charge configuration in the specific MLCs to represent multiple bits.

In the past, the programming technique that adjusted the charge configuration rendered the data in the lower page susceptible to corruption or ambiguity when, for example, a write abort occurred. Prior attempts to address this problem included reading the lower page data and saving it in a separate location. Then, if the upper page write was aborted, the lower page data could be recovered. This had both a performance and endurance penalty. Another attempt avoided writing the upper page data if the lower page data already had data, and this approach also incurred a performance and endurance penalty. Yet another attempt included using a battery to ensure that the memory device had enough power to complete a write. However, including a battery was expensive and impractical for small form factor devices. Recently, a "B-state first" programming technique has been developed, as described, for example, in U.S. Pat. Pub. No. 2010-0246260 A1. The B-state first technique has a performance penalty, however, due to the two-pass charge configuration programming technique executed when programming the second bit stored in the MLC.

SUMMARY

A memory device includes a non-volatile memory of multiple level cell (MLCs). A controller is in communication with the non-volatile memory and executes firmware that includes multiple different programming techniques for establishing a charge configuration in the MLCs that represents multiple data bits stored in the MLCs. The firmware also includes write logic that when executed by the controller causes the controller to obtain specified data to write to the MLC, select among the multiple different programming techniques to determine a selected programming technique, and write the specified data to the MLC using the selected programming technique.

In one implementation, the multiple different programming techniques include a robust programming technique that preserves previously written data in the MLCs in the event of a write abort of the specified data. The multiple different programming techniques may also include an additional programming technique that has higher average performance than the robust programming technique. Other programming techniques may be included in the firmware and selected for writing the specified data. The selection may be made based on a wide variety of criteria, including whether data has been previously written to a block that includes the MLC, whether the specified data is part of a dataset that will fill a block, and other criteria.

Other features and advantages will become apparent upon examination of the following figures, detailed description, and claims.

BRIEF DESCRIPTION OF THE DRAWINGS

The system may be better understood with reference to the following drawings and description. In the figures, like reference numerals designate corresponding parts throughout the different views.

FIG. 5 shows a memory device that includes a permissibility table.

DETAILED DESCRIPTION OF THE PREFERRED EMBODIMENTS

The discussion below makes reference to host devices and memory devices. A host device may be a wired or wireless device, may be portable or relatively stationary, and may run from DC power (e.g., battery power), AC power, or another power source. A host device may be a consumer electronic device such as a personal computer, a mobile phone handset, a game device, a personal digital assistant (PDA), an email/text messaging device, a digital camera, a digital media/content player, a GPS navigation device, a satellite signal (e.g., television signal) receiver, or cable signal (e.g., television signal) receiver. The memory device is an example of a storage device and may be flash memory embedded within the host, such as in the form of a solid state disk (SSD) drive installed in a personal computer. SSD drives may be in the form of discrete modules that are drop-in replacements for rotating magnetic disk drives. Alternatively, the memory device may be in the form of a card that is removably connected to the host. In this way, examples of memory devices include memory cards, flash drives, and solid state disk drives. Host devices may interface with memory devices that store digital content, such as music, video, documents, or other data.

Figure 1:
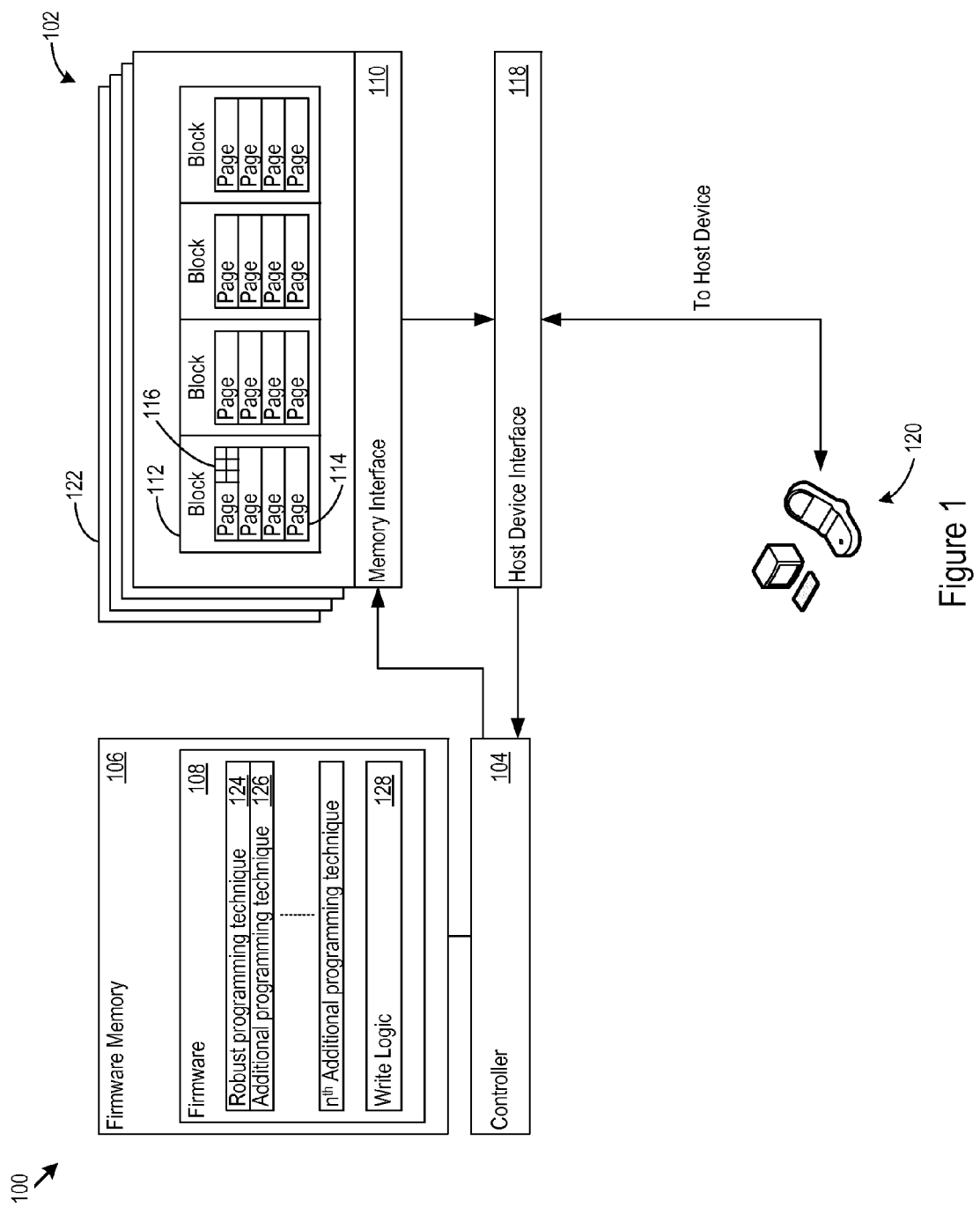
FIG. 1 shows a memory device.

FIG. 1 shows a memory device 100. The memory device 100 includes a memory array 102, a controller 104 and a firmware memory 106. The firmware memory 106 stores firmware 108 for execution by the controller 104. The controller 104 and firmware 108 handle read/write operations to the memory array 102 through the memory interface 110 as described in more detail below. The memory interface 110 may include, as examples, address decoders (e.g., row and column decoders), programming voltage control circuitry, sense circuitry, and other memory interface circuitry for reading, writing, and erasing data in the memory array 102.

The memory array 102 may include one or more dies (e.g., the die 122) of memory distributed across one or more memory packages. The memory device 100 may organize the memory array 102 into blocks (e.g., the block 112) of pages (e.g., the page 114) that extend over a predetermined number memory cells (e.g., the memory cell 116). The memory cells may be single level cells (SLCs) or multiple level cells (MLCs). As examples, blocks may be 2, 4, or 8 MBytes in size and pages may be 8 or 16 KBytes in size. However, these sizes may vary widely to meet the design requirements for any particular desired implementation.

The memory device 100 may perform read, write, and erase operations on the basis of metablocks and metapages. Metablocks may be formed as a collection of multiple blocks across multiple dies or packages (e.g., an aggregation of 4 2 MB blocks over 4 dies). Similarly, metapages may be formed as a collection of multiple pages across the metablock (e.g., 4 pages, one in each block forming a metablock). A logical metagroup may be an integer multiple (e.g., 8 or 16) of metapages. A block or metablock may be the minimum erasable unit in the memory array 102, and a page or metapage may be the minimum readable/writeable unit in the memory array 102.

A host device interface 118 implements a communication channel between the memory device 100 and the host devices 120. As examples, the host device interface 118 may be a Secure Digital (SD), micro SD, Compact Flash, or another flash memory card interface. The host devices 120 send host data to the memory device 100 for storage in the memory array 102, and issue read requests for the memory device 100 to return previously stored data from the memory array 102. The memory device 100 handles write operations of specified data into the MLCs as described in more detail below.

The firmware 108 includes multiple different programming techniques. The programming techniques may be implemented as code (e.g., software instructions) executed by the controller 104. Each of the programming techniques establishes a charge configuration, in the MLCs written to, that represents multiple data bits. The programming techniques may employ programming pulses to establish the charge configuration, such as the programming pulses disclosed in U.S. Pat. No. 7,688,638, incorporated by reference here and assigned to SanDisk Technologies Corporation. There may be any number of such programming techniques. In one implementation, the firmware includes code executed by the controller 104 that implements a robust programming technique 124, and at least one additional programming technique 126, described in more detail below.

Figure 2:
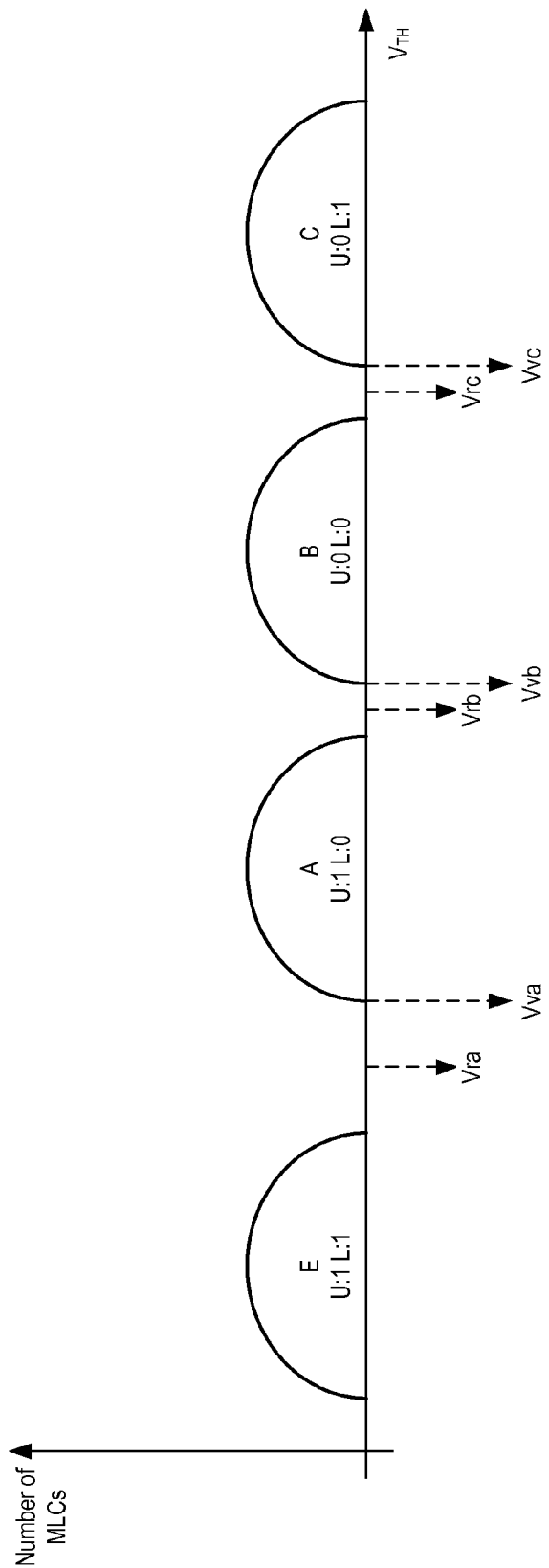
FIG. 2 shows a state diagram of a MLC.

FIG. 2 shows a state diagram 200 of a MLC that illustrates an example of the charge configurations that a MLC may use to represent two data bits. Four states are shown: an E-state, the erased state which represents an upper page bit of "1" and a lower page bit of "1" (E, U:1 L:1); an A-state, which represents an upper page bit of "1" and a lower page bit of "0" (A, U:1 L:0); a B-state, which represents an upper page bit of "0" and a lower page bit of "0" (B, U:0 L:0); and a C-state, which represents an upper page bit of "0" and a lower page bit of "1" (C, U:0 L:1). FIG. 2 also shows the threshold voltage distributions for the MLCs. Other bit assignments may be used. In some implementations, the threshold voltages for the E-state are negative, and the threshold voltages for the A-, B-, and C-states are positive.

FIG. 2 also shows three read reference voltages, Vra, Vrb, and Vrc. The controller 104 and memory interface 110 test the threshold voltage of an MLC being read to determine the data bits stored in the MLC. A threshold voltage reading under Vra may reflect the E-state or "00" data; a threshold voltage reading between Vra and Vrb may reflect the A-state or "10" data; a threshold voltage reading between Vrb and Vrc may reflect the B-state or "00" data; and a threshold voltage reading above Vrc may reflect the C-state of "01" data. FIG. 2 further illustrates three write verify reference voltages Vva, Vvb, and Vvc. The controller 104 and memory interface 110 may verify a write operation by the programming techniques by testing the MLCs to ensure that they have voltages falling into the appropriate range.

The robust programming technique may be one that preserves previously written data in the MLCs (e.g., data already present in a lower page in the MLCs) such as in the event of a write abort. One example of a robust programming technique is given in U.S. Pat. Pub. No. 2010-0246260 (the '260 publication), with respect, for example, to FIG. 3. The robust programming technique in the '260 publication uses up to two programming passes to establish the second bit of a multiple bit charge configuration in the MLC. The first programming pass for the second bit definitively places the MLC into the B-state first (to eliminate overlap with the A-state), then the second programming pass for the second bit, if required, moves the MLC into the final multi-bit state from the B-state. The programming technique described in the '260 publication is robust because if a write abort occurs during the programming of the second bit, the first bit (i.e., the bit already stored in the lower page) may be recovered without ambiguity. Other multiple pass programming techniques do not necessarily have this property. In contrast, as explained in the '260 publication, if the first programming pass is not used, and a write about occurs during a single programming pass for the second bit, then it may be impossible to determine what data was originally stored in the lower page.

In one implementation, the additional programming technique may be one that has higher average performance than the robust programming technique. One example of an additional programming technique is an "E-state first" programming technique. An E-state first programming technique starts with an erased MLC (i.e., an MLC in the "E-state") and applies programming pulses to move the MLC from the erased state directly to a charge configuration representative of multiple data bits in one programming pass. This technique may also be referred to as "full sequence" programming. Because one programming pass is used instead of up to two, the E-state first programming technique has higher average performance than the robust programming technique.

Figure 3:
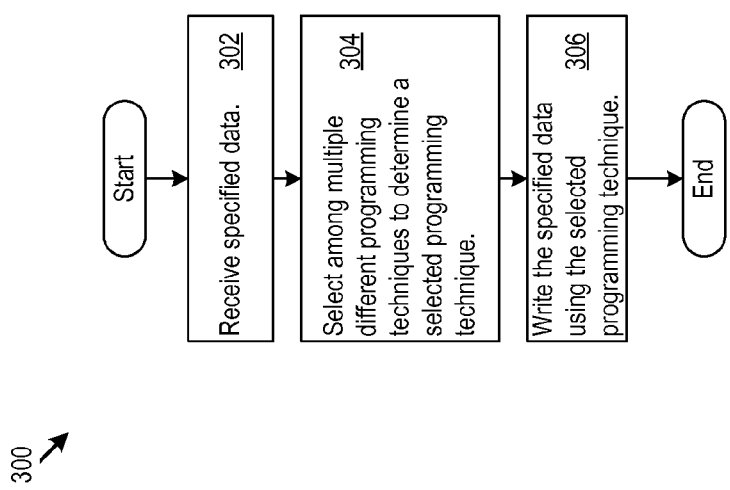
FIG. 3 shows logic flow for write logic that may be implemented in firmware to selectively apply multiple different programming techniques for MLCs.

The firmware 108 also includes controller executable code that implements write logic 128, shown in FIG. 3 by the logic flow 300. The write logic 128 may obtain specified data to write to the memory array 102 (302). The specified data may be received from the host devices 120, may originate from data already stored inside the memory device 100, or may be obtained from other sources. Examples of already stored data include data that is part of a garbage collection operation, binary cache eviction operation, or a MLC reclaim operation. The write logic 128 selects among the multiple different programming techniques to determine a selected programming technique for the specified data (304). The write logic 128 then writes the specified data to the MLC using the selected programming technique (306). In one implementation, the firmware selects between the multiple different programming techniques to achieve a particular goal in terms of performance, reliability, or other factors or combinations of factors, such as by using different programming techniques at different times to provide a blend of programming speed and robustness to write aborts.

Figure 4:
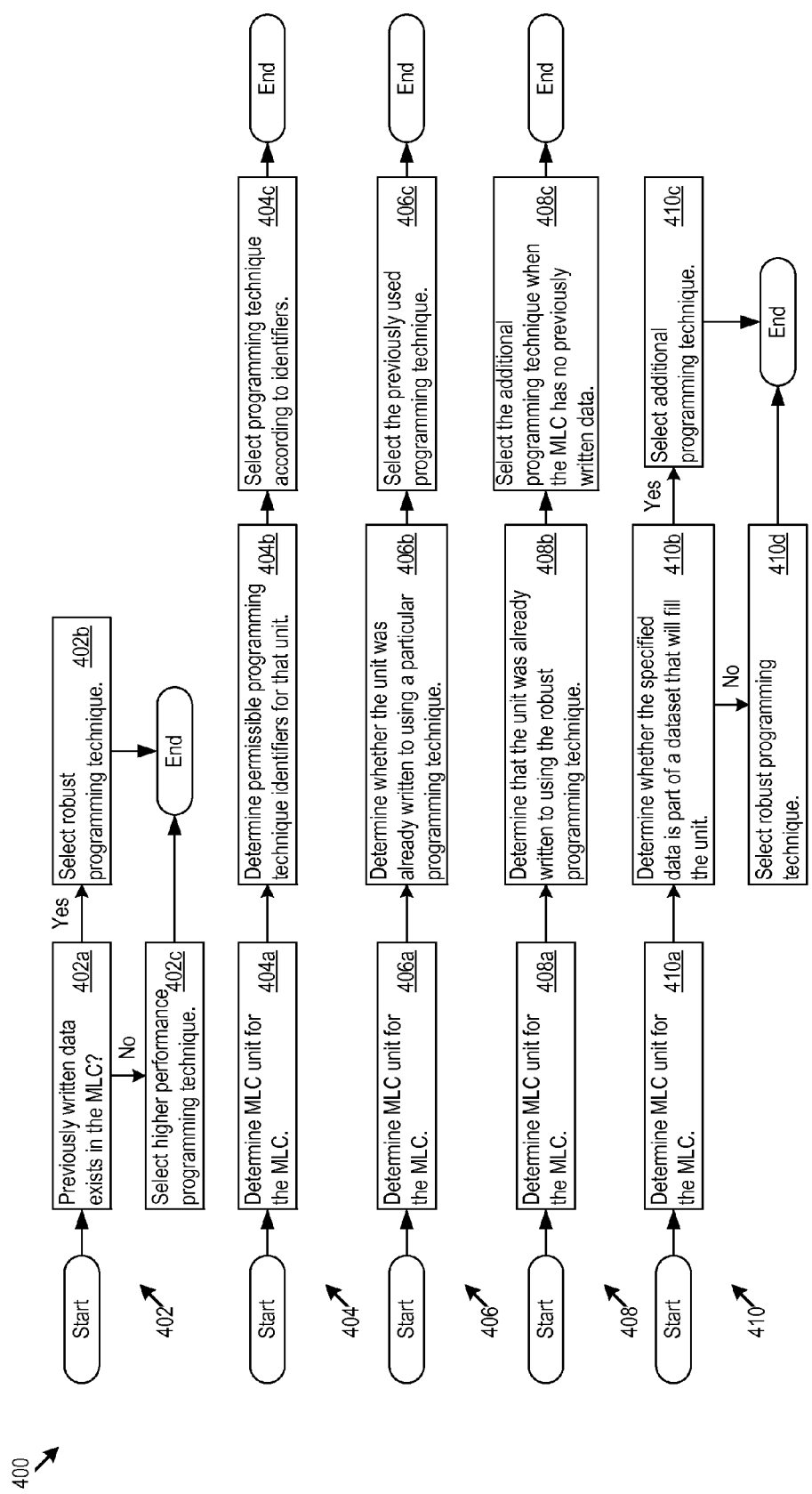
FIG. 4 shows logic flow for write logic that may be implemented in firmware to select among multiple different programming techniques for MLCs.

FIG. 4 shows flow logic 400 that provides additional detail concerning the write logic 128. In particular, FIG. 4 provides examples of decision criteria for how the write logic 128 may select the particular programming technique at (304) to apply for any given write operation. The write logic 128 may implement any other decision criteria.

For the decision criteria 402, the write logic 128 may ascertain whether any previously written data exists (e.g., in a lower page) in an MLC to which the specified data will be written (402a). If so, the write logic 128 may select the robust programming technique (402b) to ensure, for example, that the previously written data is not lost in the event of a write abort. If not, the write logic 128 may select the additional programming technique (e.g., the higher performance programming technique) (402c).

For the decision criteria 404, the write logic 128 may determine, for the MLC to which the specified data will be written, a particular unit in which the MLC exists (404a). The unit may be a block or a page, as examples. In other words, the MLC may be one of many MLCs in a page or block of multiple MLCs. For that unit, the write logic 128 determines permissible programming technique identifiers for that unit (404b). To that end, the write logic 128 may, for example, lookup the unit in a table of permissible programming technique identifiers (as described in more detail below with respect to FIG. 5). Any given identifier may specify one or more permissible programming techniques for the unit. As a result, the write logic 128 may select a programming technique based on the identifier for the unit (404c). Furthermore, for any of the decision criteria discussed above or below, the permissible programming identifiers may form an additional constraint upon the selection of a programming technique. In other words, the write logic 128 may limit the selected programming technique to one permitted by the permissible programming identifiers for an applicable block, page, cell or other unit.

For the decision criteria 406, the write logic 128 may determine, for the MLC to which the specified data will be written, a particular unit in which the MLC exists (406a). The unit may be a block or a page, as examples. The write logic 128 determines whether that unit has already been written to using a particular one of the multiple different programming techniques (406b). For example, the write logic 128 may determine that a previous write command executed using a high performance programming technique for the unit. The write logic may then use the previously used programming technique for the new write into the unit (406c). This decision criteria helps to ensure that a consistent programming technique is used for all data in a particular unit.

For the decision criteria 408, the write logic 128 may determine, for the MLC to which the specified data will be written, a particular unit in which the MLC exists (408a). Again, the unit may be a block or a page, as examples. The write logic 128 further determines that the unit has already been written to with the robust programming technique (408b). Nevertheless, when no previously written data exists in the MLC, the write logic 128 may select the additional (e.g., high performance) programming technique to write the specified data to the MLC (408c). The decision to apply the different programming technique may be further conditioned on whether the specified data fills the MLC. If it does, the write logic 128 may select the additional programming technique, and if not, the write logic 128 may select the robust programming technique. More generally, the write logic 128 may, regardless of the previously used programming technique (e.g., the robust technique) used for certain cells in a unit, apply a different (e.g., high performance) programming technique for other cells in the unit when a programming technique condition is met. In the example above, the programming technique condition was whether there was sufficient specified data to fill the MLC and therefore chose the higher performance programming technique.

For the decision criteria 410, the write logic 128 may determine, for the MLC to which the specified data will be written, a particular unit in which the MLC exists (410a). As noted above, the unit may be a block or a page, as examples. The write logic 128 may then determine whether the specified data is part of a dataset that will fill the unit (410b). For example, when the MLC is part of a 2 MB block, the write logic may determine whether the specified data is part of a 2 MB or larger dataset. If it is, then the write logic 128 may select the additional (e.g., higher performing) programming technique (410c). Otherwise, the write logic may select a different programming technique (e.g., the robust programming technique) (410d). Similarly, the specified data may be part of a datastream (e.g., arriving from the host devices 120) that the write logic 128 recognizes as one that may end partially through the particular unit. As examples, there may be no specific datastream size specified, or the datastream may be one that the host 120 could terminate at any time. In recognition of the uncertain extent of the datastream, the write logic 128 may select a particular programming technique, such as the robust programming technique.

The write logic 128 may implement other strategies for selecting a programming technique. For example, the write logic 128 may employ a strategy that applies the robust programming technique only when needed according to a selected criteria (e.g., only when needed when write about protection is desired). Part of this strategy may be to mix use of the B-state first and E-state first programming techniques within the same block or metablock. For any partially written metablock there may be some number of lower pages that contain data that have been acknowledged to the host as being committed to the memory array 102. If the data in these pages are corrupted during an upper page program, there may be no other copy of this data in the system and the data may be permanently lost. Thus, when a new write command is received by the memory device 100, the write command will contain data which has not been committed to the memory array 102. When both lower page and upper page data is from the same uncommitted command, the write logic 128 may select the faster E-state first sequence to maximize performance. In other implementations, the strategy may operate selected blocks or metablocks entirely with the B-state first programming technique and blocks or metablocks entirely with the E-state first sequence. The write logic 128 may use the E-state first sequence, for example, for blocks or metablocks in which an entire block or metablock of data is available to be written. For example, binary cache eviction or MLC reclaim operations may provide sufficient data. Furthermore, the write logic 128 may select the B-state first sequence for blocks where the datastream may be stopped partially through the block.

FIG. 5 shows a second example of a memory device 500. The memory device 500 includes a permissibility table 502. The permissibility table 502 may be implemented in nonvolatile or volatile memory, and may be static or dynamic (e.g., reprogrammable by a host 120, or modified during operation of the memory device 500 by the firmware 108). As one specific example, the permissibility table 502 may be implemented as a portion of the memory array 102. Alternatively, the permissibility table 502 may be implemented as volatile memory (e.g., DRAM or SRAM) internal or external to the controller 104.

The permissibility table 502 stores any number of permissible programming technique identifiers 504 ("identifiers"). In one implementation, the permissibility table 502 stores identifiers applicable to blocks or metablocks. For example, in FIG. 5 block 0 has an identifier of 0x02. That identifier may indicate, for example, that only the robust programming technique may be used for that block. Alternatively or additionally, the permissibility table 502 may store identifiers at any other unit of granularity. For example, the permissibility table 502 may store identifiers for pages or metapages, or for individual MLCs. FIG. 5 shows a particular example in which page 77 has an identifier of 0x03 (e.g., both the robust and alternative programming technique may be used), and MLC number 232,010 (illustrated in FIG. 5 as 506) has an identifier of 0x01 (illustrated in FIG. 5 as 508) (e.g., only the alternative programming technique may be used).

In some implementations, upon boot-up or initialization of the memory device 500, the controller 104 populates the permissibility table 502. The controller 104 may read default or pre-set identifiers present in the non-volatile memory array 102 and store them in the permissibility table 502 for use after boot-up or initialization. Alternatively, the controller 104 may obtain the indicators from the host devices 120, or from another source. The controller 104 may change the indicators during device operation, thereby reconfiguring the permissibility table 502 to adapt the memory device 500, as one example, to updated write strategies.

The methods, devices, and logic described above may be implemented in many different ways in many different combinations of hardware, software or both hardware and software. For example, all or parts of the controller 104 may include circuitry in a controller, a microprocessor, programmable logic array, or an application specific integrated circuit (ASIC), or may be implemented with discrete logic or components, or a combination of other types of circuitry. All or part of the logic may be implemented as instructions for execution by a processor, controller, or other processing device and may be stored in a machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A memory device comprising:
   a non-volatile memory comprising a multiple level cell (MLC);
   a controller in communication with the non-volatile memory; and
   firmware comprising:
      multiple different programming techniques for establishing a charge configuration in the MLC that represents multiple data bits stored in the MLC; and
      write logic that when executed by the controller causes the controller to:
         obtain specified data to write to the MLC;
         select among the multiple different programming techniques to determine a selected programming technique; and
         write the specified data to the MLC using the selected programming technique.

2. The memory device of claim 1, where the multiple different programming techniques comprise:
   a robust programming technique that preserves previously written data in the MLC in the event of a write abort of the specified data; and
   an additional programming technique that has higher average performance than the robust programming technique.

3. The memory device of claim 2, where the write logic, when executed, causes the controller to:
   determine that the previously written data exists in the MLC, and in response select the robust programming technique.

4. The memory device of claim 2, where the write logic, when executed, causes the controller to:
   determine that the previously written data exists in a lower page of the MLC, and in response select the robust programming technique to preserve the previously written data in the lower page in the event of the write abort.

5. The memory device of claim 2, where the write logic, when executed, causes the controller to:
   determine that no previously written data exists in the MLC, and in response select the additional programming technique to write the specified data.

6. The memory device of claim 1, where the write logic, when executed, causes the controller to:
   determine that the MLC exists in a particular unit of multiple MLCs;
   determine a permissible programming technique predetermined for that particular unit; and
   determine the selected programming technique according to the permissible programming technique for that particular unit.

7. The memory device of claim 1, where the write logic, when executed, causes the controller to:
   determine that the MLC is part of a particular unit of multiple MLCs that has already been written to with a particular one of the multiple different programming techniques, and in response select that particular one of the multiple different programming techniques for the MLC.

8. The memory device of claim 2, where the write logic, when executed, causes the controller to:
   determine that the MLC is part of a particular unit of multiple MLCs that has already been written to with the robust programming technique;
   determine that no previously written data exists in the MLC; and
   select the additional programming technique to write the specified data to the MLC.

9. The memory device of claim 2, where the write logic, when executed, causes the controller to:
   determine that the MLC is part of a particular unit of multiple MLCs;
   determine that the specified data is part of a dataset that will fill the particular unit; and
   in response, select the additional programming technique.

10. The memory device of claim 2, where the write logic, when executed, causes the controller to:
    determine that the MLC is part of a particular unit of multiple MLCs;

determine that the specified data is part of a datastream that may end partially through the particular unit; and in response, select the robust programming technique.

11. A memory device comprising:
a non-volatile memory comprising multiple blocks of multiple level cells (MLCs), each block corresponding to a minimum erasable unit in the memory device;
a table comprising permissible programming technique identifiers for the blocks;
a controller in communication with the non-volatile memory; and
firmware comprising:
programming techniques for establishing charge configurations in the MLCs that represent multiple data bits stored in the MLCs, including:
a robust programming technique that preserves previously written data in the MLC in the event of a write abort of the specified data;
an additional programming technique that has higher average performance than the robust programming technique; and
write logic that when executed by the controller causes the controller to:
obtain specified data to write to the non-volatile memory;
determine a selected block among the multiple blocks in which to write the specified data;
determine an applicable permissible programming technique identifier for the selected block from among the multiple permissible programming technique identifiers;
select among the multiple different programming techniques to determine a selected programming technique based at least in part on the applicable permissible programming technique identifier; and
write the specified data using the selected programming technique.

12. The memory device of claim 11, where the additional programming technical has higher average write performance than the robust programming technique.

13. The memory device of claim 11, where the write logic, when executed, causes the controller to:
determine that no previously written data exists in the selected block, and in response select the additional programming technique to write the specified data when the applicable permissible programming technique identifier specifies the additional programming technique.

14. The memory device of claim 11, where the write logic, when executed, causes the controller to:
determine that previously written data exists in a lower page of at least one of the MLCs in the selected block, and in response select the robust programming technique to preserve the previously written data when the applicable permissible programming technique identifier specifies the robust programming technique.

15. The memory device of claim 11, where the write logic, when executed by the controller, further causes the controller to:
change the applicable permissible programming technique identifier for the selected block in the table to specify only the a selected programming technique.

16. A method for writing data to a multiple level cell (MLC) in a memory device, the method comprising, in the memory device:

obtaining specified data to write to the MLC;
selecting among multiple different programming techniques, each of which establishes a charge configuration in the MLC that represents multiple data bits, to determine a selected programming technique; and
writing the specified data to the MLC using the selected programming technique.

17. The method of claim 16, where selecting comprises:
selecting among:
a robust programming technique that preserves previously written data in the MLC in the event of a write abort of the specified data; and
an additional programming technique that has higher average performance than the robust programming technique.

18. The method of claim 17, where selecting comprises:
determining that the previously written data exists in the MLC, and in response selecting the robust programming technique.

19. The method of claim 17, where selecting comprises:
determining that the previously written data exists in a lower page of the MLC, and in response selecting the robust programming technique to preserve the previously written data in the lower page in the event of the write abort.

20. The method of claim 17, where selecting comprises:
determining that no previously written data exists in the MLC, and in response selecting the additional programming technique to write the specified data.

21. The method of claim 16, where selecting comprises:
determining that the MLC exists in a particular unit of multiple MLCs;
determining a permissible programming technique for that particular unit; and
determining the selected programming technique according to the permissible programming technique.

22. The method of claim 16, where selecting comprises:
determining that the MLC is part of a particular unit of multiple MLCs that has already been written to with a particular one of the multiple different programming techniques, and in response selecting that particular one of the multiple different programming techniques for the specified data.

23. The method of claim 17, where selecting comprises:
determining that the MLC is part of a particular unit of multiple MLCs that has already been written to with the robust programming technique;
determining that no previously written data exists in the MLC; and
selecting the additional programming technique to write the specified data to the MLC.

24. The method of claim 17, where selecting comprises:
determining that the MLC is part of a particular unit of multiple MLCs;
determining that the specified data is part of a dataset that will fill the particular unit; and
in response, selecting the additional programming technique.

25. The method of claim 17, where selecting comprises:
determining that the MLC is part of a particular unit of multiple MLCs;
determining that the specified data is part of a datastream that may end partially through the particular unit; and
in response, selecting the robust programming technique.

* * * * *